United States Patent
Hsieh et al.

(12) 
(10) Patent No.: US 6,248,643 B1
(45) Date of Patent: *Jun. 19, 2001

(54) METHOD OF FABRICATING A SELF-ALIGNED CONTACT

(75) Inventors: Chien-Sheng Hsieh; Wei-Ray Lin, both of Taipei; Fu-Liang Yang, Tainan; Erik S. Jeng, Hsinchu; Bor-Ru Sheu, Hsinch, all of (TW)

(73) Assignee: Vanguard International Semiconductor Corporation, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/285,534

(22) Filed: Apr. 2, 1999

(51) Int. Cl.[7] .......................... H01L 21/76; H01L 21/762
(52) U.S. Cl. .......................... 438/424; 438/197; 438/299; 438/218; 438/221
(58) Field of Search ..................................... 438/221, 224, 438/253, 675, 424, 299, 197, 218

(56) References Cited

U.S. PATENT DOCUMENTS

| | | |
|---|---|---|
| 5,082,795 | 1/1992 | Temple .................................. 437/41 |
| 5,087,584 | 2/1992 | Wada et al. ............................ 437/43 |
| 5,231,051 * | 7/1993 | Baldi et al. . |
| 5,283,201 | 2/1994 | Tsang et al. ........................... 437/31 |
| 5,316,957 | 5/1994 | Spratt et al. ........................... 437/31 |
| 5,316,975 | 5/1994 | Maeda .................................. 437/195 |
| 5,677,227 * | 10/1997 | Yang et al. . |
| 5,706,164 * | 1/1998 | Jeng . |
| 5,721,154 * | 2/1998 | Jeng . |
| 5,753,555 * | 5/1998 | Hada . |
| 5,789,792 * | 8/1998 | Tsutsumi . |

* cited by examiner

*Primary Examiner*—Charles Bowers
*Assistant Examiner*—Stephen W. Smoot
(74) *Attorney, Agent, or Firm*—George O. Saile; Stephen B. Ackerman; William J. Stoffel

(57) ABSTRACT

A method for fabricating self-aligned contacts using elevated trench isolation, selective contact plug deposition and planarization starting at the device level. The process begins by successively forming a gate oxide layer and a first gate electrode layer on a silicon substrate. Next, fully planarized trench isolation regions are formed using sacrificial oxide and nitride layers and selective etching. A sacrificial pad oxide layer and a first sacrificial nitride layer are formed. The first sacrificial nitride layer, the sacrificial pad oxide layer, the first gate electrode layer, the gate oxide layer, and the silicon substrate are patterned to form trenches. A fill oxide layer is deposited in the trenches and over the first sacrificial nitride layer. An oxide etch is performed which recesses the fill oxide layer in the trenches below the level of the top of the first nitride layer. A second sacrificial nitride layer is formed on the fill oxide layer and over the first sacrificial nitride layer. Chemical-mechanical polishing is performed. Successive oxide etch, nitride etch and oxide etch steps are performed defining elevated trench isolation regions fully planarized with the first gate electrode layer. A silicide layer, a dielectric layer and a top nitride layer are formed. The top nitride layer, the dielectric layer, the silicide layer, the first gate electrode layer and the gate oxide layer are patterned forming gate structures between elevated trench isolation regions and conductive lines on elevated trench isolation regions. Spacers are formed on the sidewalls of the gate structures, the conductive lines and the elevated trench isolation regions. Then, self-aligned contact plugs are formed adjacent to the spacers.

16 Claims, 3 Drawing Sheets

METHOD OF FABRICATING A SELF-ALIGNED CONTACT

BACKGROUND OF INVENTION

1) Field of the Invention

This invention relates generally to fabrication of semiconductor devices and more particularly to the fabrication of a self-aligned contacts using elevated trench isolation, selective contact plug deposition and planarization starting at the device level.

2) Description of the Prior Art

Semiconductor applications require increasing packaging density. To accomplish the increased density, device geometries are scaled. Line widths are reduced and the number of levels is increased. As line widths decrease and the number of interconnecting levels increase, it becomes increasingly difficult to form conductor lines and contacts using conventional fabrication methods.

One problem which limits scaling is mask alignment. When more than one mask is used to fabricate a semiconductor, device sizes must be larger than theoretically required to compensate for misalignment between masks. With each additional mask, the alignment tolerances are increased.

Another problem which limits scaling is the errors induced by variations in exposure during phtolithography caused by uneven surface topography.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,316,975 (Maeda) shows a method for an interconnect process.

U.S. Pat. No. 5,316,957 (Spratt et al.) discloses a process for fabricating a bipolar transistor with a recessed contact.

U.S. Pat. No. 5,283,201 (Tsang et al.) teaches a contact process for a recessed gate formed in a trench on a substrate.

U.S. Pat. No. 5,087,584 (Wada et al.) shows a process for forming a floating gate memory array using a wordline trench.

U.S. Pat. No. 5,082,795 (Temple) shows a FET with a self aligned structure.

SUMMARY OF THE INVENTION

It is an object of the present invention to provide a new interconnection process suitable for reduced line width applications.

It is another object of the present invention to provide a new interconnection process using trench isolators, isolation spacers and selective contact plug formation to form self aligned contacts and reduce the number of photolithography steps.

It is another object of the present invention to provide a contact formation process which maintains planarization starting from the device level enhancing the photolithography resolution.

It is yet another object of the present invention to provide an economical and robust process for manufacturing interconnections for DRAM applications.

To accomplish the above objectives, the present invention provides a method for fabricating self-aligned contacts using elevated trench isolation, selective contact plug deposition and planarization starting at the device level. The process begins by successively forming a gate oxide layer and a first gate electrode layer on a silicon substrate. Next, fully planarized trench isolation regions are formed using sacrificial oxide and nitride layers and selective etching. A sacrificial pad oxide layer and a first sacrificial nitride layer are formed. The first sacrificial nitride layer, the sacrificial pad oxide layer, the first gate electrode layer, the gate oxide layer, and the silicon substrate are patterned to form trenches. A fill oxide layer is deposited in the trenches and over the first sacrificial nitride layer. An oxide etch is performed which recesses the fill oxide layer in the trenches below the level of the top of the first nitride layer. A second sacrificial nitride layer is formed on the fill oxide layer and over the first sacrificial nitride layer. Chemical-mechanical polishing is performed. Successive oxide etch, nitride etch and oxide etch steps are performed defining elevated trench isolation regions fully planarized with the first gate electrode layer. A silicide layer, an dielectric layer and a top nitride layer are formed. The top nitride layer, the dielectric layer, the silicide layer, the first gate electrode layer and the gate oxide layer are patterned forming gate structures between elevated trench isolation regions and conductive lines on elevated trench isolation regions. Spacers are formed on the sidewalls of the gate structures, the conductive lines and the elevated trench isolation regions. Then, self-aligned contact plugs are formed adjacent to the spacers.

The present invention provides considerable improvement over the prior art. One of the most significant limitations of scaling is the photolthography processing window. As the distance from the mask to the wafer increases, resolution decreases. Non-planar topography limits resolution because of how close the mask can be to the wafer. Because the wafer is fully planarized prior to the photolithography step, the present invention can acheive superior resolution.

Layer surfaces that are not parallel to the top surface can cause defraction during photolithography resulting in distortion of the mask image. The improved planarization of the present invention starting from the device level prevents such distortion. Because structures do not have to be sized to compensate for this distortion the present invention facilitates the use of smaller strucures.

Multiple masking and etching steps increase complexity, processing time and misalignment error accumulation. The present invention provides simplified photolithography and etching processes for contact hole formation due to the self-aligned contact formation process.

Polysilicon contact plugs limit device speed due to the contact resistance. The present invention provides reduced contact resistance due to a silicon or tungsten contact.

The present invention achieves these benefits in the context of known process technology. However, a further understanding of the nature and advantages of the present invention may be realized by reference to the latter portions of the specification and attached drawings. Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the appended claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method of fabricating selfaligned contacts using elevated trench isolation, selective contact plug deposition and planarization starting at the device level.

In the following description, the term substrate is meant to include a silicon semiconductor substrate and any processing performed prior to that point in the description.

Figure 1:
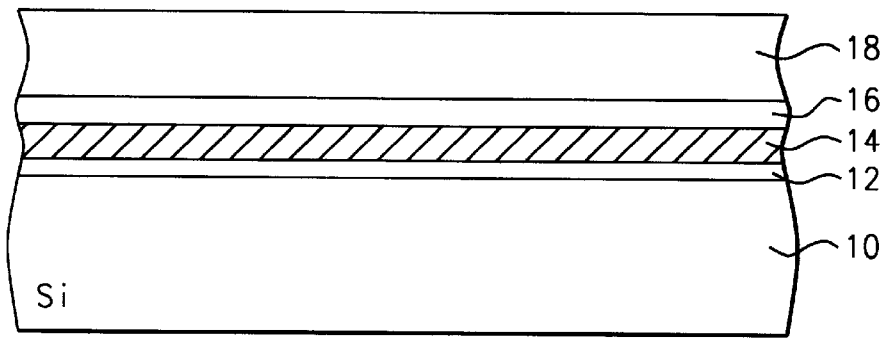
FIGS. 1, 2, 3, 4, 5, 6, 7, 8 & 9 illustrate sequential sectional views of a process for fabrication of a self-aligned contacts according to the present invention using elevated trench isolation, selective contact plug deposition and planarization starting at the device level.

Referring to FIG. 1, the process begins by forming a gate oxide layer (12) on a silicon substrate (10). The gate oxide layer (12) is preferably thermally grown to a thickness of between about 20 Å and 200 Å. A first gate electrode layer (14) is formed on the gate oxide layer (12). The first gate electrode layer (14) is preferably composed of polycrystalline silicon (polysilicon) having a thickness between about 800 Å and 1500 Å. A polysilicon first gate electrode can be formed by pryolyzing silane. Preferably, the first gate electrode layer is doped in-situ using phosphorous ions at a concentration of between about $10^{19}$ atm/cm$^3$ and $10^{22}$ atm/cm$^3$.

Still referring to FIG. 1, a sacrificial pad oxide layer (16) is formed on the first gate electrode layer (14). The sacrificial pad oxide layer (16) is preferably thermally grown to a thickness of between about 50 Å and 200 Å. A first sacrificial silicon nitride (Si3N4) layer (18) is formed on the sacrificial pad oxide layer (16). The first sacrificial silicon nitride layer (18) is preferably deposited to a thickness of between 1800 Å and 2200 Å using an atmospheric or low pressure CVD process.

Figure 2:
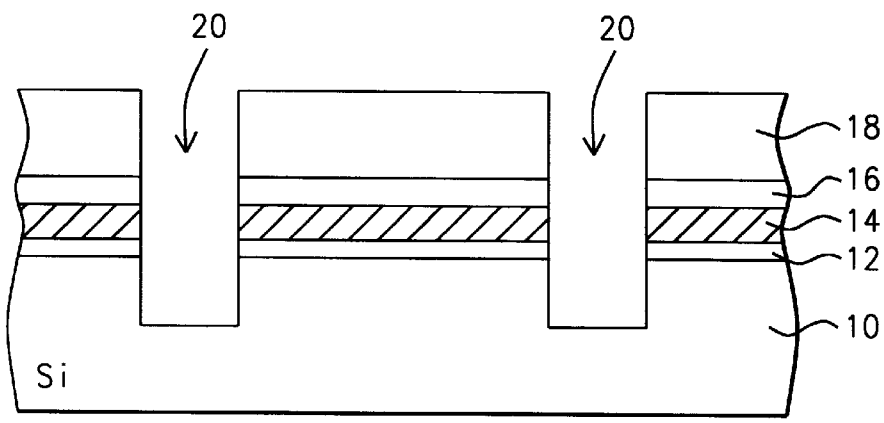

Referring to FIG. 2, the first sacrificial silicon nitride layer (18), the sacrificial pad oxide layer (16), the first gate electrode layer (14), the gate oxide layer (12) and the silicon substrate are patterned to form trenches (20), defining device areas therebetween. The trenches preferably extend to a depth of between 3000 Å and 6000 Å below the level of the top of the silicon substrate (10).

Figure 3:
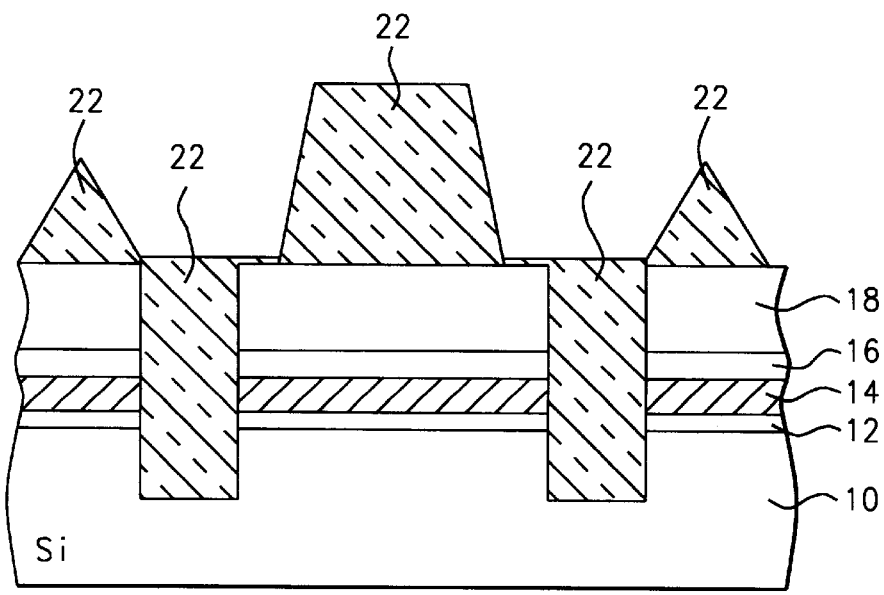

Referring to FIG. 3, a fill oxide layer (22) is formed over the first sacrificial silicon nitride layer (18) and in the trenches (20). The fill oxide layer (22) is deposited to a thickness sufficient to fill the trenches (20) to a level above the top of the first sacrificial silicon nitride layer (18). The fill oxide layer (22) can be deposited by reacting silane with oxygen.

Figure 4:
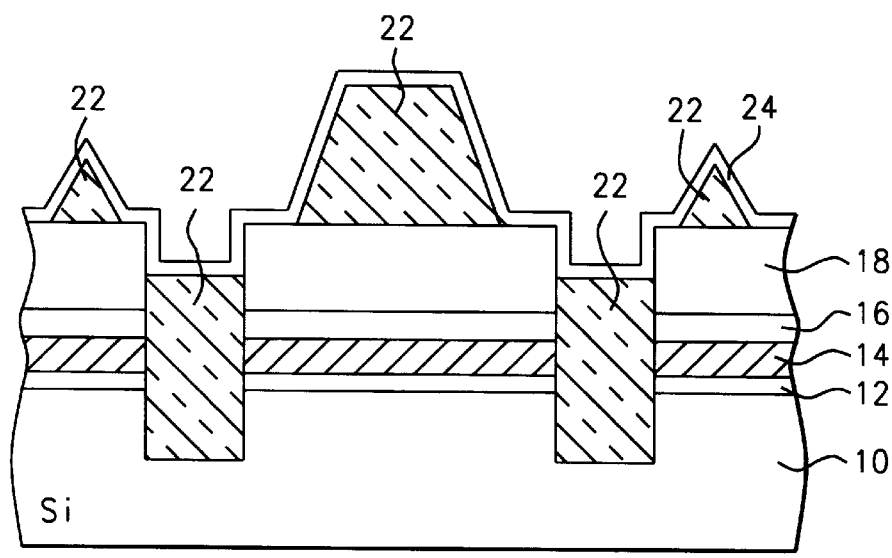

Referring to FIG. 4, the fill oxide layer (22) is partially removed in a wet etch such as hydrofluoric acid. The etch is timed to partially remove the fill oxide layer (22) in the trenches (20) so that it is recessed below the level of the top of the first sacrificial silicon nitride layer (18). After partially etching, the filled oxide layer (22) in the trenches (20) is preferably at a level between about 1000 Å to 1500 Å below the top of the first sacrificial silicon nitride layer (18).

Still referring to FIG. 4, a second sacrificial silicon nitride layer (24) is formed over the first sacrificial silicon nitride layer (18) and the fill oxide layer (22). The second sacrificial silicon nitride layer (24) is preferably formed to a thickness of between 500 Å and 800 Å using low pressure chemical vapor deposition (LPCVD).

Figure 5:
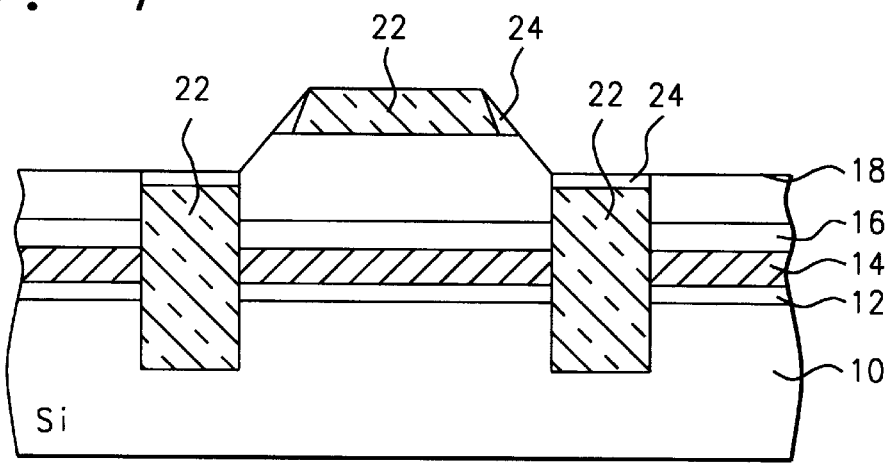

Referring to FIG. 5, chemical-mechanical polishing (CMP) is performed on the substrate. The CMP is controlled so that part of the second sacrificial silicon nitride layer (24) remains on the fill oxide layer (22) in the trenches (20). As shown in FIG. 5, part of the fill oxide layer (22) remains over the first sacrificial silicon nitride layer (18) following CMP.

Figure 6:
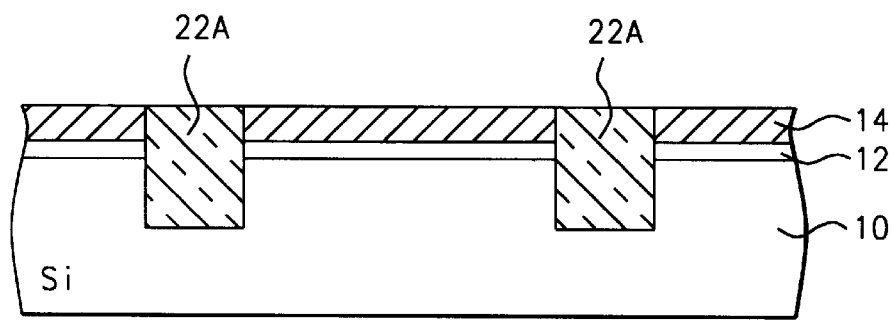

Referring to FIG. 6, a series of etching steps are performed to provide a fully planarized substrate having elevated trench isolation regions (22A) and a first gate electrode layer (14) therebetween. First, the remaining portion of the fill oxide layer (22) over the first sacrificial silicon nitride layer (18) is removed, preferably using a buffered oxide etch (BOE). Since the fill oxide layer (22) in the trenches (20) is covered by the second sacrificial silicon nitride layer (24) and the BOE is selective to oxide, the fill oxide layer (22) in the trenches (20) is not effected by this etch. Next, the remaining portions of the first sacrificial nitride layer (18) and the second sacrificial nitride layer (24) are removed using a hot phosphoric acid etch. Finally, the fill oxide layer (22) in the trenches (20) is etched to the level of the top of the first gate electrode layer (14) using a second timed BOE, thereby defining elevated trench isolation regions (22A). The sacrificial pad oxide layer (16) is also removed during the second timed BOE.

A key advantage of the present invention is that it provides elevated trench isolation regions (22A) and still provides a fully planarized surface during photolithography steps to form gates. The fully planarized surface prevents errors induced by variations in exposure during photolithography.

Figure 7:
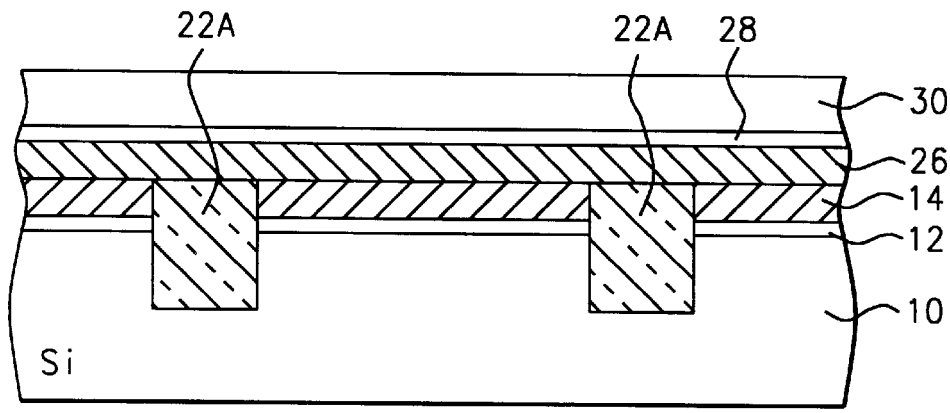

Referring to FIG. 7, a silicide layer (26) is formed on the first gate electrode layer (14) and the elevated trench isolation regions (22A). The silicide layer (26) is preferably composed of WSi, deposited using evaporation or sputtering. Preferably, the suicide layer has a thickness between about 800 Å and 1500 Å.

Still referring to FIG. 7, a dielectric layer (28) is formed on the silicide layer (26). The dielectric layer (28) can be formed using a tetraethylorthosilicate oxide (TEOS) by deposting silicon oxide at 650° C. to 750° C. in a low pressure chemical vapor deposition chamber. The dielectric layer (28) preferably has a thickness of between about 300 Å and 500 Å.

Still referring to FIG. 7, a top silicon nitride layer (30) (Si$_3$N$_4$) is formed on the dielectric layer (28). The top silicon nitride layer can be deposited using low pressure chemical vapor deposition (LPCVD). The top silicon nitride layer (30) preferably has a thickness of between about 1500 Å and 2500 Å.

Figure 8:
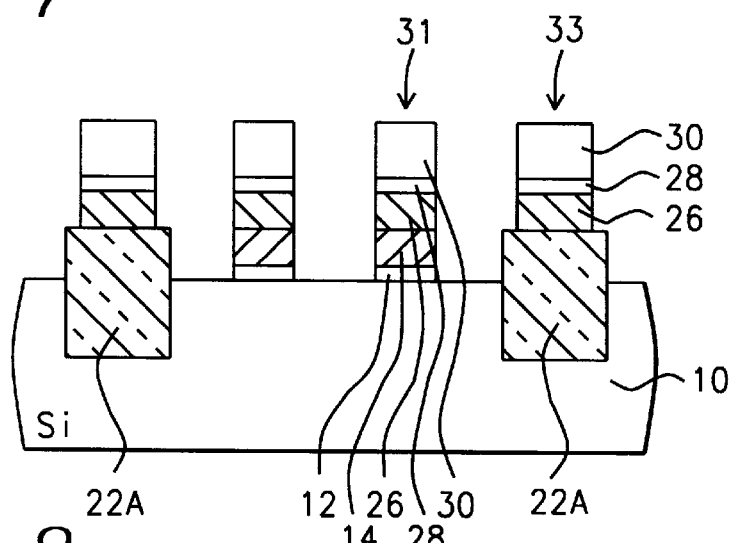

Referring to FIG. 8, the top silicon nitride layer (30), the dielectric layer (28), the silicide layer (26), the first gate electrode layer (14), and the gate oxide layer (12) are patterned using photolithography defining gate structures (31) on the substrate (10). The patterning step also defines conductive lines (33) on the elevated trench isolation regions (22A) comprising the silicide layer (26), the dielectric layer (28) and the top silicon nitride layer (30).

Another key advantage of the present invention is that a fully planarized surface is provided for the photolithography step. Also, the top silicon nitride layer (30), the dielectric layer (28) and the silicide layer (26) are each of uniform thickness and planar. This planarity and uniformity facilitates more accurate photolithography and smaller structures.

Figure 9:
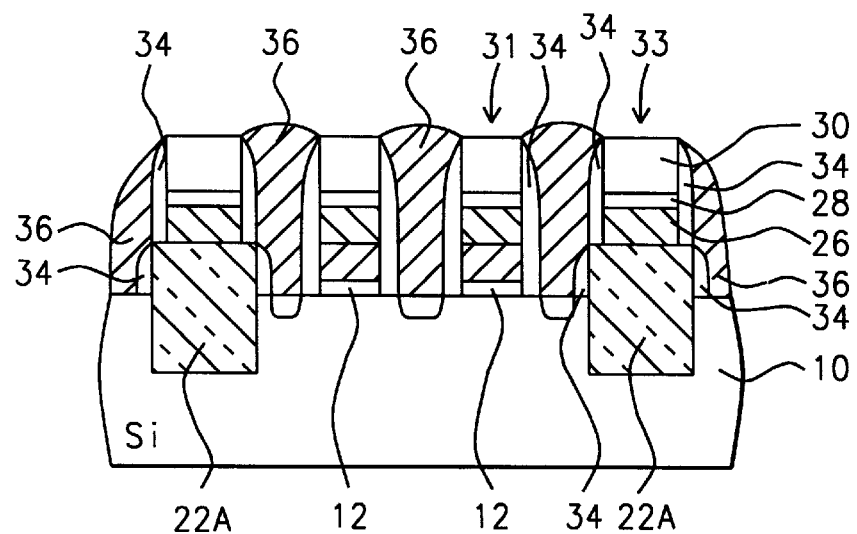

Referring to FIG. 9, spacers (34) are formed on the sidewalls of the gate structures (31), the conductive lines (33) and the elevated trench isolation regions (22A). The spacers (34) can be composed of silicon dioxide or silicon nitride. They are preferably formed by chemical vapor deposition and anisotropic etch.

Still referring to FIG. 9, self-aligned contact plugs (36) are selectively formed on the substrate (10) adjacent to the spacers (34). The self-aligned contact plugs (36) can be composed of Tungsten or epitaxial silicon. Selective growth of epitaxial silicon can be performed in a cold wall ultra-high vacuum chemical vapor deposition system using $Si_2H_6$. Phosphorous doped epitaxial silicon can be grown anisotropically at a temperature between 650C and 750C and a pressure between about 0.8 mTorr and 1.2 mTorr using a Si2H6 flow rate of between about 0.8 sccm and 1.2 sccm.

While the invention has been particularly shown and described with reference to the preferred embodiments thereof, it will be understood by those skilled in the art that various changes in form and details may be made without departing from the spirit and scope of the invention.

What is claimed is:

1. A method of fabricating self-aligned contacts using elevated trench isolation, selective contact plug deposition and planarization starting at the device level comprising the steps of:
   a. providing a semiconductor substrate having elevated trench isolation regions dividing and defining active areas there between; said substrate having thereon a gate oxide layer in said active areas; said gate oxide layer having thereon a first gate electrode layer; wherein said elevated trench isolation regions are formed coplanar to said gate electrode layer by forming sequential sacrificial oxide, nitride, oxide, and nitride layer and performing sequential chemical-mechanical polishing, selective oxide, selective nitride and timed oxide etches;
   b. forming a silicide layer on said first gate electrode layer and on said elevated trench isolation regions; said silicide layer being planar with uniform thickness;
   c. forming a dielectric layer on said silicide layer; said dielectric layer being planar with uniform thickness;
   d. forming a top nitride layer on said dielectric layer; said nitride layer being planar with uniform thickness;
   e. patterning said top nitride layer, said dielectric layer, said silicide layer, said first gate electrode layer and said gate oxide layer using photolithography; thereby forming gate structures with sidewalls between said elevated trench isolation regions and conductive lines with sidewalls on said elevated trench isolation regions; said elevated trench isolation regions having sidewalls; whereby said substrate is exposed adjacent to said gate structures; said photolithography being performed on a fully planar surface;
   f. forming spacers on said sidewalls of said gate structures, said conductive lines and said elevated trench isolation regions; and
   g. selectively forming contact plugs on said substrate adjacent to said spacers.

2. The method of claim 1 wherein said first gate electrode layer has a thickness between 800 Å and 1500 Å.

3. The method of claim 1 wherein said silicide layer is composed of Tungsten Silicide.

4. The method of claim 1 wherein said contact plugs are composed of epitaxial silicon.

5. The method of claim 1 wherein said contact plugs are composed of Tungsten.

6. A method of fabricating self-aligned contacts using elevated trench isolation, selective contact plug deposition and planarization starting at the device level consisting of the steps of:
   a. forming a gate oxide layer on a silicon substrate;
   b. forming a first gate electrode layer on said gate oxide layer;
   c. forming a sacrificial pad oxide layer on said first gate electrode layer;
   d. forming a first sacrificial nitride layer on said sacrificial pad oxide layer;
   e. patterning said first sacrificial nitride layer, said sacrificial pad oxide layer, said first gate electrode layer, said gate oxide layer, and said silicon substrate to form trenches;
   f. forming a fill oxide layer in said trenches and over said first sacrificial nitride layer;
   g. performing an oxide etch; whereby said fill oxide layer in said trenches is recessed below the level of the top of said first nitride layer;
   h. forming a second sacrificial nitride layer on said fill oxide layer and over said first sacrificial nitride layer;
   i. performing chemical-mechanical polishing on said second sacrificial nitride layer, said fill oxide layer, and said first sacrificial nitride layer stopping on said second sacrificial nitride layer in said trenches;
   j. performing an oxide etch; whereby the portions of said fill oxide layer not in said trenches are removed;
   k. performing a nitride etch; whereby the first sacrificial nitride layer and the second sacrificial nitride layer are removed;
   l. performing an oxide etch; whereby the sacrificial pad oxide layer is removed and elevated trench isolation regions are defined;
   m. forming a silicide layer on said first gate electrode layer and on said elevated trench isolation regions;
   n. forming a dielectric layer on said silicide layer;
   o. forming a top nitride layer on said dielectric layer;
   p. patterning said top nitride layer, said dielectric layer, said silicide layer, said first gate electrode layer and said gate oxide layer; thereby forming gate structures with sidewalls between said elevated trench isolation regions and conductive lines with sidewalls on said elevated trench isolation regions; said trench isolation regions having sidewalls; whereby said substrate is exposed adjacent to said gate structures;
   q. forming a dielectric spacer layer over said top nitride layer;
   r. etching said spacer layer to form spacers on said sidewalls of said gate structures, said conductive lines and said elevated trench isolation regions; and
   s. selectively forming contact plugs on said substrate adjacent to said spacers.

7. The method of claim 6 wherein said first gate electrode layer has a thickness of between about 800 Å and 1500 Å.

8. The method of claim 6 wherein said sacrificial pad oxide layer has a thickness of between about 50 Å and 200 Å.

9. The method of claim 6 wherein said first sacrificial silicon nitride layer has a thickness of between about 1800 Å and 2200 Å.

10. The method of claim 6 wherein said trench extends into said substrate a depth of between 3000 Å and 6000 Å.

11. The method of claim 6 wherein, following the first oxide etch, said fill oxide layer is recessed to a depth of between 1000 Å and 1500 Å below the level of the top of said first sacrificial nitride layer.

12. The method of claim 6 wherein said second sacrificial nitride layer has a thickness between 500 Å and 800 Å.

13. The method of claim 6 wherein said oxide etch steps use a buffered oxide etch (BOE) process and said nitride etch is peformed using a hot $H_3PO_4$ dip.

14. The method of claim 6 wherein said silicide layer is composed of Tungsten Silicide.

15. The method of claim 6 wherein said contact plugs are composed of epitaxial silicon.

16. The method of claim 6 wherein said contact plugs are composed of Tungsten.

* * * * *

UNITED STATES PATENT AND TRADEMARK OFFICE
CERTIFICATE OF CORRECTION

PATENT NO.    : 6,248,643 B1
DATED         : June 19, 2001
INVENTOR(S)   : Chien-Sheng Hsieh, Wei-Ray Lin, Fu-Liang Yang, Erik S. Jeng, Bor-Ru Sheu It is certified that error appears in the above-identified patent and that said Letters Patent is hereby corrected as shown below:

<u>Title page,</u>
Item [75], delete "Hsinch" and replace with -- Hsinchu --.

Signed and Sealed this

Twenty-sixth Day of February, 2002

Attest:

Attesting Officer

JAMES E. ROGAN
*Director of the United States Patent and Trademark Office*